United States Patent
Lamy et al.

(10) Patent No.: US 10,586,810 B2
(45) Date of Patent: Mar. 10, 2020

(54) SOI SUBSTRATE COMPATIBLE WITH THE RFSOI AND FDSOI TECHNOLOGIES

(71) Applicant: COMMISSARIAT A L'ENERGIE ATOMIQUE ET AUX ENERGIES ALTERNATIVES, Paris (FR)

(72) Inventors: Yann Lamy, Saint Etienne de Crossey (FR); Lamine Benaissa, Massy (FR); Etienne Navarro, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/003,199

(22) Filed: Jun. 8, 2018

(65) Prior Publication Data
US 2018/0358381 A1 Dec. 13, 2018

(30) Foreign Application Priority Data
Jun. 13, 2017 (FR) ...................... 17 55314

(51) Int. Cl.
*H01L 29/00* (2006.01)
*H01L 27/12* (2006.01)
(Continued)

(52) U.S. Cl.
CPC .... *H01L 27/1203* (2013.01); *H01L 21/02381* (2013.01); *H01L 21/02675* (2013.01);
(Continued)

(58) Field of Classification Search
CPC ............ H01L 29/0692; H01L 29/0634; H01L 29/407; H01L 21/84; H01L 21/743;
(Continued)

(56) References Cited

U.S. PATENT DOCUMENTS

2007/0032040 A1 2/2007 Lederer
2009/0124038 A1* 5/2009 Tuttle ................ H01L 27/14643
438/70
(Continued)

FOREIGN PATENT DOCUMENTS

EP 1 665 367 4/2005
FR 2 973 158 9/2012
(Continued)

OTHER PUBLICATIONS

French Search Report dated Feb. 9, 2018, issued in French Application No. 17 55314, filed Jun. 13, 2017 (with English Translation of Categories of Cited Documents).

*Primary Examiner* — Theresa T Doan
(74) *Attorney, Agent, or Firm* — Oblon, McClelland, Maier & Neustadt, L.L.P.

(57) ABSTRACT

A semiconductor on insulator type substrate, comprising at least:
a support layer;
a semiconductor surface layer;
a buried dielectric layer located between the support layer and the semiconductor surface layer;
a trap rich layer located between the buried dielectric layer and the support layer, and comprising at least one polycrystalline semiconductor material and/or a phase change material;
in which the trap rich layer comprises at least one first region and at least one second region adjacent to each other in the plane of the trap rich layer, the material of the at least one first region being in an at least partially recrystallized state and having an electrical resistivity less than that of the material in the at least one second region.

7 Claims, 3 Drawing Sheets

(51) Int. Cl.
*H01L 29/06* (2006.01)
*H01L 21/84* (2006.01)
*H01L 21/324* (2006.01)
*H01L 21/268* (2006.01)
*H01L 21/763* (2006.01)
*H01L 21/762* (2006.01)
*H01L 21/02* (2006.01)

(52) U.S. Cl.
CPC ........ *H01L 21/2686* (2013.01); *H01L 21/324* (2013.01); *H01L 21/763* (2013.01); *H01L 21/76264* (2013.01); *H01L 21/84* (2013.01); *H01L 29/0607* (2013.01)

(58) Field of Classification Search
CPC ........... H01L 21/76897; H01L 27/0203; H01L 27/085; H01L 27/1207; H01L 29/0603; H01L 29/0638; H01L 29/0843; H01L 29/0847; H01L 21/30625; H01L 21/74; H01L 21/762; H01L 21/763; H01L 27/1214; H01L 29/1033

USPC ......................................................... 257/504
See application file for complete search history.

(56) References Cited

U.S. PATENT DOCUMENTS

2014/0084290 A1    3/2014  Allibert et al.
2014/0367786 A1*  12/2014  Bedell ................ H01L 27/1203
                                                                257/369
2015/0155170 A1    6/2015  Reboh et al.
2017/0077314 A1    3/2017  Smith et al.
2017/0331501 A1   11/2017  Kononchuk et al.

FOREIGN PATENT DOCUMENTS

FR          3 029 682        6/2016
FR          3 033 933        9/2016

* cited by examiner

SOI SUBSTRATE COMPATIBLE WITH THE RFSOI AND FDSOI TECHNOLOGIES

TECHNICAL DOMAIN AND PRIOR ART

The invention relates to the field of RFSOI (Radio-Frequency Silicon On Insulator) and FDSOI (Fully Depleted Silicon On Insulator) substrates, and semiconductor devices made from such substrates.

There are two distinct types of SOI substrates used for different electronic applications:
- RFSOI substrates used for Radio Frequency (RF) applications as Front End modules;
- FDSOI substrates used for high performance low consumption digital applications, and for the fabrication of FDSOI type components.

These two types of SOI substrates have specific characteristics adapted for one of these two distinct applications.

Thus, an FDSOI substrate comprises a thin silicon surface layer (for example 10 nm thick), a thin buried dielectric layer or BOX (for example 20 nm thick), and a support layer or solid layer made of slightly doped silicon (for example with a resistivity of between about 0.1 and 1 Ohm·cm) placed under the BOX to enable back polarisation of FDSOI transistors made in this substrate. Therefore mobility in the channel of such an FDSOI transistor can be controlled from the back face of the substrate that forms a back gate of the transistor, due to a slightly resistive lateral contact accessible from the front face of the substrate and that is connected to the portion of doped silicon located under the BOX of the transistor. This back polarisation can be used to modulate the performances (particularly the speed) and/or the consumption of the transistors made, and particularly their threshold voltage. However, this requires good electrical conduction between the front face contact and the doped zone formed under the BOX of the transistor.

On the contrary, an RFSOI substrate comprises a highly resistive support layer (for example with a resistivity greater than or equal to about 0.5 kΩ·cm, or even more than 1 kΩ·cm) to limit losses in RF or passive components made on or in such a substrate.

A major problem that occurs for RF applications is the presence of a parasite conduction layer formed by parasite free charges generated by the presence of fixed charges in the BOX of the substrate. This is particularly damaging to the linearity of RF signals that account for non-negligible powers (0 to 30 dBm), and causes crosstalk.

To solve this problem, it is possible to have a "trap rich" layer just underneath the BOX to capture free charges and thus considerably reduce or even eliminate formation of the parasite conducting layer. This trap rich layer is formed, typically by PECVD, LPCVD deposition or by epitaxy, on the support layer just before the RFSOI substrate fabrication process. The RF components are then fabricated on the RFSOI substrate in the same way as on a classical SOI substrate.

Advantageously, the trap rich layer is formed by a deposit of polysilicon. Unlike other techniques, the polysilicon makes it possible to achieve a high trap density, a high resistivity (between about 5 and 10 kOhm·cm), and good thermal stability at high temperature (up to about 1100° C.) compatible with the use of a CMOS process, while enabling the possibility of depositing or growing a silicon oxide to passivate the layer and thus make direct bonding of this oxide layer possible during fabrication of this substrate.

An example of a method of making an RFSOI substrate comprising a trap rich layer is described in document EP 1 665 367 A1.

Document FR 2 973 158 A1 also describes a technique to stabilise the grains in the trap rich layer by inserting a thin dielectric layer between the trap rich layer and the support layer to prevent or delay untimely recrystallization of the trap rich layer that is responsible for the drop in efficiency of this layer.

In all cases, the trap rich layer of an RFSOI substrate is formed uniformly on the substrate and is designed to be thermally stable.

With the upcoming technologies (22 nm and smaller), and emergence of the IoT (Internet Of Things) and 5G (fifth generation of standards for mobile telephony), it would be very interesting to have a high performance 501 substrate for existing FDSOI type active devices and also for passive devices and RF devices.

However, the presence of a highly resistive trap rich layer, useful for passive or RF components, is incompatible with back polarisation of FDSOI transistors and that requires conduction between the insulation zones and under the BOX so as to control the back gates of FSDOI transistors in voltage through the back face.

Furthermore, shaping of the trap rich layer that would consist of forming this layer only at locations to be used for RF or passive components during fabrication of the SOI substrate is not industrially feasible because it would require the founder or the integrated circuit fabricator to give details and the drawing of circuits to be made to the manufacturer of the substrate that will be used for fabrication of the integrated circuits.

Presentation of the Invention

Thus there is a need to propose a new semiconductor on insulator type substrate with the advantages of an RFSOI substrate comprising a trap rich layer, while being compatible with the FDSOI technology and particularly with back polarisation of FDSOI components, and particularly FDSOI transistors, made on this substrate.

To achieve this, it is proposed a semiconductor on insulator type support, comprising at least:
- a support layer;
- a semiconducting surface layer;
- a buried dielectric layer located between the support layer and the surface layer;
- a trap rich layer located between the buried dielectric layer and the support layer, and comprising at least one polycrystalline semiconducting material and/or a phase change material;

in which the trap rich layer comprises at least one first region and at least one second region adjacent to each other in the plane of the trap rich layer, the material of the first region being in an at least partially recrystallized state and having an electrical resistivity less than that of the material in the second region.

This substrate comprises a trap rich layer, the structure of which is such that the benefits of an RFSOI structure can be associated with the benefits of an FDSOI structure within a single substrate, through the fabrication of distinct regions within the trap rich layer, these distinct regions having different properties depending on whether they will form part of an RFSOI region of the substrate or an FDSOI region of the substrate.

The use of a polycrystalline semiconductor and/or a phase change material to form the trap rich layer makes it possible to make a local adjustment of the properties of this layer, for example through the use of a laser, and thus to delimit different regions within this layer depending on the FDSIO or RFSOI properties required for each region.

The majority of traps in the trap rich layer are formed at grain boundaries, where they are associated with pendant bonds of the material. Depletion regions and potential barriers are formed around grains to compensate for charges trapped at grain boundaries. The surface area of grain boundaries must be maximised so as to increase the density of traps and consequently the efficiency of the trap rich layer, which implies that the grain size must be reduced. For example, polysilicon grains with a size of between about 100 nm and 150 nm can be used to obtain the nominal resistivity of silicon that is of the order of 5 kOhm·cm.

The uniformity of the grain size, the columnar structure and the morphology of grains within the trap rich layer along its thickness have a strong influence on the efficiency at which parasite currents are reduced. The thickness of the trap rich layer also plays an important role.

Furthermore, the resistivity of the trap rich layer and its property of reducing parasite conduction reduce with increasing grain size. By locally heating the first region(s) of the trap rich layer, the material within this or these first regions recrystallizes, generating an increase in the grain size of the material within this or these first regions. This reduces the electrical resistivity of this recrystallized material and makes this or these regions adapted to the FDSOI technology, while keeping the other region(s) of the substrate compatible with the RFSOI technology.

This local adjustment may correspond to significant heating of the material in the first region, modifying the structure of the grains from which it is composed and lowering its resistivity.

The part of the substrate including the first region of the trap rich layer and the portions of other layers of the substrate located on this first region form a part of the substrate adapted to the fabrication of FDSOI components. The part including the second region of the trap rich layer and the portions of other layers of the substrate located on this second region form a part of the substrate adapted to the fabrication of RF and/or passive components.

Therefore the substrate comprises a trap rich layer that can be deactivated or modulated locally as a function of the required characteristics within the different regions of the substrate, particularly regions that will receive active zones of FDSOI components. The regions on which passive and/or RF components (inductor, transmission lines, etc.) will be made are located facing a functional "trap rich" region, i.e. a region in which the material in the trap rich layer is in a non-recrystallized state.

Therefore this substrate comprises highly resistive regions under the buried dielectric layer, without a parasite conduction zone at the location at which the trap rich layer is functional (non-recrystallized material), and regions that are less electrically resistive at the location at which the properties of the trap rich layer have been modified, so that back polarisation of active components made at these regions becomes possible.

The material in the first region of the trap rich layer is recrystallized such that the grain structure of this material is modified (increase in the grain size) lowering the resistivity of the material in this first region. Recrystallization may be continued until the recrystallized material in the first region is monocrystalline.

Due to the lower electrical resistivity of the material in the first region of the trap rich layer, this material can be used to form a back polarisation gate of FDSOI components made at this first region.

The plane of the trap rich layer corresponds to the principal plane of this layer that is parallel to the interfaces between the different layers of the substrate.

The trap rich layer may comprise at least one of the following materials: polycrystalline silicon, polycrystalline germanium, polycrystalline silicon-germanium, phase change material.

The trap rich layer is advantageously sensitive in absorption to lighting (in other words capable of absorbing electrons from this lighting) making use of at least one wave length at which the material of the support layer and/or the material of the surface layer is transparent, for example a wave length in the infrared range. This is the case when polycrystalline germanium and/or polycrystalline SiGe and/or a phase change material is used to form the trap rich layer and silicon is used to form the support layer and/or the surface layer, the lighting used emitting one or more wave lengths in the infrared range.

Advantageously, the melting temperature of the material in the surface layer is higher than the recrystallization temperature of the trap rich layer to give good selectivity of heating when the trap rich layer is heated through the surface layer. This is the case particularly when the surface layer comprises monocrystalline silicon that has a high melting temperature (about 1415° C.) and the trap rich layer comprises polycrystalline silicon (recrystallization temperature between about 800° C. and 900° C.), polycrystalline Ge, polycrystalline SiGe, or a phase change material. This may also be applicable between the material in the trap rich layer and the material in the support layer when lighting takes place through the support layer.

A phase change material has the advantage that its crystalline state is reversible and it can quickly change from the crystalline state to the amorphous state, or vice versa.

A thickness of each of the grains in the material in the first region may be equal to or close to the thickness of the trap rich layer, which can give good electrical conductivity of the material in the first region.

The trap rich layer may comprise a phase change material that is in the crystalline state in the first region and in the amorphous state in the second region.

The substrate may comprise a heat absorption layer located between the trap rich layer and the support layer. In this case, the main function of the heat absorption layer is to absorb radiation used to heat and recrystallize the material in the first region of the trap rich layer.

In this case:
the trap rich layer may comprise polycrystalline silicon, and
the heat absorption layer may comprise polycrystalline germanium or polycrystalline silicon-germanium or a phase change material.

When the heat absorption layer comprises polycrystalline germanium or polycrystalline silicon-germanium or a phase change material, the material in this layer that receives the thermal radiation is also at least partially recrystallized.

It is also proposed a semiconducting device comprising at least:
a substrate like that described above;
a first insulation trench passing through at least the surface layer, the buried dielectric layer and the trap rich layer of the substrate and separating the first and second regions in the trap rich layer of the substrate from each other;

an FDSOI component made in a first portion of the surface layer of the substrate that is superposed on the first region of the trap rich layer of the substrate;

a passive and/or RF component made in and/or on a second portion of the surface layer of the substrate that is superposed on the second region of the trap rich layer of the substrate;

The device may also include:

a doped well formed in a portion of the substrate support layer in contact with the first region of the trap rich layer of the substrate;

a second insulation trench passing through at least the surface layer, the buried dielectric layer and the trap rich layer of the substrate and separating first and second parts of the first region of the trap rich layer of the substrate that are electrically connected to each other through the doped well, the first part of the first region of the trap rich layer of the substrate forming a back polarisation plane, or back gate, for the FDSOI component;

an electric contact passing through the surface layer and the buried dielectric layer, in contact with the second part of the first region of the trap rich layer of the substrate.

The electric contact may be used to apply an electric potential on the first part of the first region of the trap rich layer through the doped well and the second part of the first region of the trap rich layer.

It is also proposed a method of fabricating a semiconductor on insulator type substrate, including fabrication of a stack comprising:

a support layer;

a semiconducting surface layer;

a buried dielectric layer located between the support layer and the surface layer;

a trap rich layer located between the buried dielectric layer and the support layer, and comprising at least one polycrystalline semiconducting material and/or a phase change material;

and also comprising, in the trap rich layer, at least one first region and at least one second region adjacent to each other in the plane of the trap rich layer, during which the material in the first region is at least partially recrystallized such that its electrical resistivity less than that of the material in the second region.

Fabrication of the first region may include the use of local annealing of the material in the first region, by laser.

The laser emits light for which the wavelength is absorbed by the trap rich layer. The effect of the laser is to achieve significant annealing close to the melting temperature of the trap rich layer and increase the grain size of this material. This increase in the grain size of the material in the trap rich layer reduces the trap density at the interface with the buried dielectric layer. For example, this has the effect of reducing or even destroying the electric charge trapping effect at the location at which the FDSOI components will be fabricated, while also guaranteeing good resistivity and very good linearity in zones of the substrate dedicated to RF.

The surface layer of the substrate may comprise monocrystalline silicon and, during the local laser annealing of the material in the first region, the laser may be focussed on the first region of the trap rich layer through the surface layer and the buried dielectric layer of the substrate.

The wavelength of light emitted by the laser may be chosen such that this light is not absorbed by silicon in the surface layer, for example in the infrared range.

As a variant, during local laser annealing of the material in the first region, the laser may be focussed on the first region of the trap rich layer through at least the support layer of the substrate.

In this case, the buried dielectric layer may act as a thermal barrier so that the surface layer is not heated.

According to another variant, the substrate may also comprise a heat absorption layer arranged between the trap rich layer and the support layer, and the laser may be focussed on a region of the heat absorption layer superposed on the first region of the trap rich layer and through at least the support layer of the substrate.

It is also proposed a method of fabricating a semiconducting device comprising at least:

the use of a method of fabrication of a semiconductor on insulator type substrate like that described above;

fabrication of at least one first insulation trench between the first and second regions of the trap rich layer of the substrate, passing through at least the surface layer, the buried dielectric layer and the trap rich layer of the substrate;

fabrication of at least one FDSOI component made in a first portion of the surface layer of the substrate that is superposed on the first region of the trap rich layer of the substrate;

fabrication of at least one passive and/or RF component in and/or on a second portion of the surface layer of the substrate that is superposed on the second region of the trap rich layer of the substrate.

In this method, the components (in other words the FDSOI component(s) and the passive and/or RF component(s)) may be made before or after creating the first and second regions in the trap rich layer. When the components are made before the first and second regions of the trap rich layer are fabricated, the material in the first region(s) is recrystallized (for example by exposure to laser radiation) through the back face of the substrate to avoid damaging the components.

The method may also include:

fabrication of a second insulation trench passing through at least the surface layer, the buried dielectric layer and the trap rich layer of the substrate, and separating the first and second parts of the first region of the trap rich layer of the substrate;

implantation of dopants in a portion of the support layer of the substrate that is located in contact with the first region of the trap rich layer of the substrate, forming a doped well electrically connecting the first and second parts of the first region of the trap rich layer of the substrate to each other;

fabrication of an electrical contact passing through the surface layer and the buried dielectric layer, in contact with the second part of the first region of the trap rich layer of the substrate, allowing control of a back polarisation plane of the FDSOI component formed by the first part of the first region of the trap rich layer of the substrate.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 1:
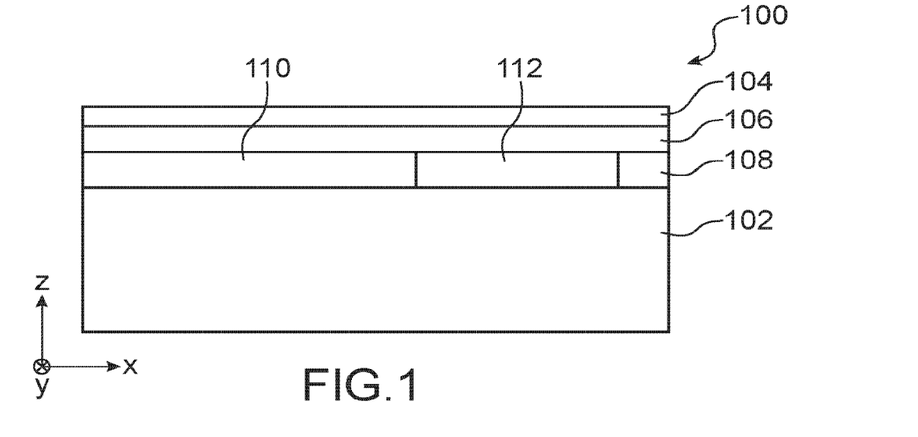
FIG. 1 shows a first embodiment of a semiconductor on insulator type substrate.

Refer firstly to FIG. 1 that diagrammatically shows a first embodiment of a semiconductor on insulator type substrate 100.

The substrate 100 comprises a support layer 102 that acts as a mechanical support layer. This layer 102 comprises a material said to be a "high resistivity" material, in other words its electrical resistivity is more than about 0.5 kΩ·cm, and preferably more than about 1 kΩ·cm or even more than about 3 kΩ·cm, so that this layer 102 is compatible with the fabrication of passive and/or RF components, in other words compatible with the RFSOI technology. In the first embodiment described herein, the layer 102 comprises silicon. For example, the electrical resistivity of this silicon is equal to about 5 kΩ·cm. The thickness of the layer 102 is equal to several hundred microns.

The substrate 100 also comprises a semiconducting surface layer 104. Electronic components will be made on and/or in this layer 104. In the first embodiment described herein, the layer 104 comprises monocrystalline silicon. Therefore the substrate 100 is a silicon on insulator (SOI) type substrate. The thickness of the layer 104 is for example between about 10 nm and 20 nm.

The substrate 100 also comprises a buried dielectric layer 106, or BOX, located between the layers 102 and 104. For example, this layer 106 comprises $SiO_2$ and its thickness is between about 10 nm and 100 nm, and advantageously between about 10 nm and 25 nm.

The substrate 100 also comprises a trap rich layer 108, located between the layers 102 and 106. The layer 108 is between about 200 nm and 500 nm thick.

In the first embodiment, the layer 108 comprises a polycrystalline semiconducting material. This polycrystalline semiconductor may be polycrystalline silicon, or polycrystalline germanium, or polycrystalline SiGe.

The layer 108 is not homogeneous because it comprises at least one first region 110 and at least one second region 112 located side by side in the plane of layer 108 (in other words side by side in a plane parallel to the (X,Y) plane shown on FIG. 1). Each of these regions 110, 112 occupies the entire thickness of the layer 108, in other words its thickness is equal to the thickness of the layer 108.

The first region(s) 110 comprise(s) the polycrystalline semiconductor mentioned above but that has been subjected to an at least partial recrystallization. The second region(s) 112 comprise(s) this same polycrystalline semiconductor but on which this recrystallization step has not been carried out. The electrical resistivity of the material in the first regions 110 is less than the electrical resistivity of the material in the second regions 112.

Recrystallization that occurs on the material in the first region(s) 110 increases the grain size of this material, reducing or eliminating the capacity of the material in this or these first regions 110 to trap electric charges and reducing the electrical resistivity of this material. The thickness of the grains in the material in the layer 108 in the first region(s) 110 is equal to the thickness of the layer 108.

As a variant to the first embodiment described above, the trap rich layer 108 may comprise a phase change material instead of a polycrystalline semiconducting material. In this case, this material is in the crystalline state in the first regions(s) 110 and in the amorphous state in the second region(s) 112.

Such a phase change material may for example by a material in the chalcogenides family, for example $Ge_XSb_YTe$ in which $0<X\leq1$, $0\leq Y<1$ and $X+Y=1$.

A phase change material may be deposited with classical microelectronics tools for example by a PVD, PECVD deposition in the amorphous or crystalline phase and with a thickness of between about 100 nm and several microns.

In the amorphous state, phase change materials have a very high resistivity, of the order of 1 MΩ·cm. In the crystalline state, these materials are electrically conducting and have a very low resistivity, of the order of a few mΩ·cm.

These phase change materials can reversibly change from the amorphous state to the crystalline state depending on the profile (duration and intensity) of the annealing applied to them. The change from the amorphous state to the crystalline state usually takes place at between about 500° C. and 700° C.

A method of fabricating the substrate 100 is described with reference to FIGS. 2A and 2B.

Figure 2A:
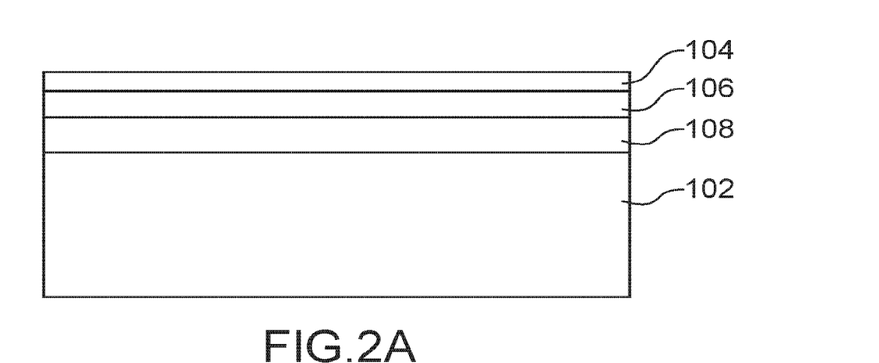
FIGS. 2A and 2B show the steps of a method of fabricating a semiconductor on insulator type substrate according to the first embodiment.
Figure 2B:
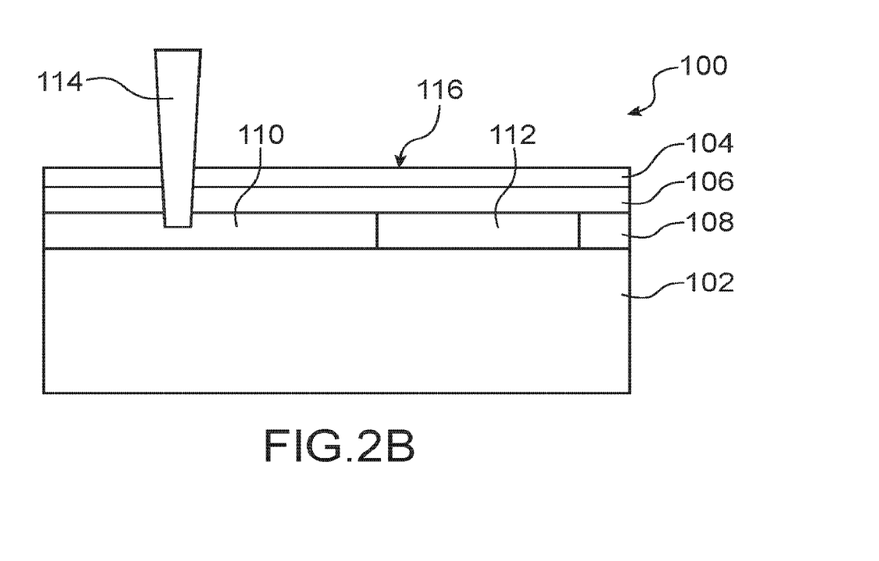

The first step is to fabricate a stack of layers 102, 108, 106 and 104, as shown on FIG. 2A. These layers can be formed by carrying out several successive deposition steps.

An at least partial recrystallization of the material in layer 108 is then implemented at the part(s) of the layer 108 that will form the first region(s) 110. In this case, this recrystallization corresponds to a local annealing performed using a laser with a beam shown on FIG. 2B with reference 114. On the example in FIG. 2B, this annealing is applied through a front face 116 of the substrate 100, in other words the laser beam passes through the layers 104 and 106 before reaching the layer 108. As a variant, the material in the first region(s) 110 may be recrystallized through a back face 118 of the substrate 100, the laser beam 114 passing through the support layer 102 before reaching the material in the layer 108.

The laser used may be a pulsed laser, so that the power can be increased locally to reach the required temperatures for recrystallization of the material in the layer 108. The laser emission device used may for example have the following properties:
wavelength: 1.035 µm,
output power: 40 W,
energy: 40 µJ (at 1 MHz),
frequency: 1 MHz,
beam diameter at 1 metre: 2.7 mm +/−0.3.

For example, in this case the laser is used such that the diameter of the input beam to the layers of the substrate 100 is between 0.5 mm and 2 mm, so that a good resolution can be obtained between the regions 110, 112. Advantageously, the wavelength of the laser beam used can be between about 1.3 µm and 1.4 µm, the difference in absorption of such a wavelength by Ge and Si being very significant.

For example, a Ge layer 108 with a thickness equal to 200 nm located under an $SiO_2$ layer 106 with a thickness equal to 25 nm and under a Si layer 104 with a thickness equal to 20 nm can reach a temperature of about 900° C., namely a temperature close to the melting point of germanium and making partial recrystallization of germanium in layer 108 possible, using a 500 µJ laser pulse with a duration of 1.45 ns generated by the emission device described above. With such a laser pulse, the temperature of the layer 104 does not exceed 500° C., and therefore does not alter the silicon in the layer 104, particularly due to the thermal barrier formed by the layer 106 between the layers 104 and 108.

In this first embodiment, the trap rich layer 108 has electric charge trapping properties and is also sensitive to the laser used for recrystallization of the material in the first regions 110.

Polycrystalline germanium has the advantage that it strongly absorbs wavelengths in the infrared range (wavelength longer than about 1 µm). Thus, a laser emitting infrared light can be used to produce different regions 110, 112 within the layer 108, these wavelengths not being absorbed or being only slightly absorbed by the silicon that can form the layer 104. This is also the case when a phase change material is used to form the layer 108 and when the layer 104 contains silicon.

Furthermore, germanium has a direct gap, which facilitates absorption of light excitation and a lower melting temperature than silicon, which is conducive to the phase change of the layer 108 when it comprises germanium.

However, the charge trapping effect obtained with polycrystalline germanium is lower than when polycrystalline silicon is used.

Polycrystalline SiGe can thus be used in the layer 108 to stabilise the material, create conditions more suitable for growth of the material in layer 108 and increase the resistivity of the final material obtained (in comparison with germanium).

Polycrystalline Ge and/or SiGe and/or Si can be deposited in existing PECVD, LPCVD type microelectronics or epitaxy frames.

As a variant to the method described above, it is possible to use several laser beams simultaneously focussed at the same point in layer 108 to recrystallize the material in the first regions 110. Thus, heating of layer 104 is limited when these beams pass through the front face 116 of the substrate 100 and when they pass through the different portions of the layer 104. This variant can also be applied when the beams enter the device 100 through the back face 118 formed by the layer 102.

Figure 3:
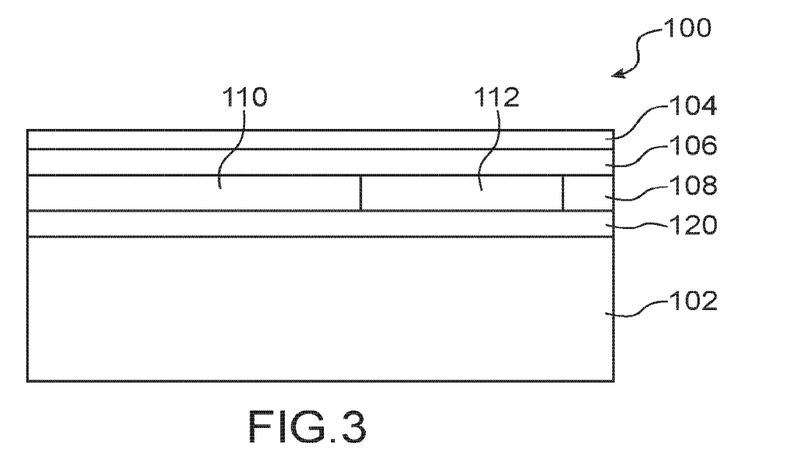
FIGS. 3 and 4 show a second embodiment and a third embodiment respectively of a semiconductor on insulator type substrate.

FIG. 3 shows a second embodiment of the substrate 100.

In this second embodiment, in addition to the layers 102, 104, 106 and 108 described above with reference to the first embodiment, the substrate 100 comprises a heat absorption layer 120 located between the trap rich layer 108 and the support layer 102. The material in layer 120 is chosen such that it is sensitive to the wavelength of the laser used to recrystallize the material in the first regions 110. The layer 120 is in thermal contact with layer 108. Furthermore, the layer 120 is preferably very electrically insulating, or at least semiconducting with reduced electronic mobility to avoid adding electrical conductivity under the layer 106. The layer 120 is also compatible with microelectronics front end processes that will be used to make components on the substrate 100. Finally, the layer 120 is thick enough to capture the thermal energy necessary for recrystallization of the material of layer 108, for example between about 30 nm and 3 µm.

Advantageously, the layer 108 comprises polycrystalline silicon, and the layer 120 comprises polycrystalline germanium or polycrystalline SiGe or a phase change material.

In this second embodiment, the thermal absorption and electric charge trapping functions are dissociated and distributed on the two layers 108 and 120. Thus, the material in layer 108 can be chosen for its excellent charge trapping properties without it necessarily being very absorbent relative to the radiation used for recrystallization, and the material of layer 120 is chosen to be very sensitive to heating. This second embodiment enables to optimise the annealing effect of the laser by increasing the absorption of laser radiation.

As a variant, the layer 120 may correspond to a stack of several layers.

Figure 4:
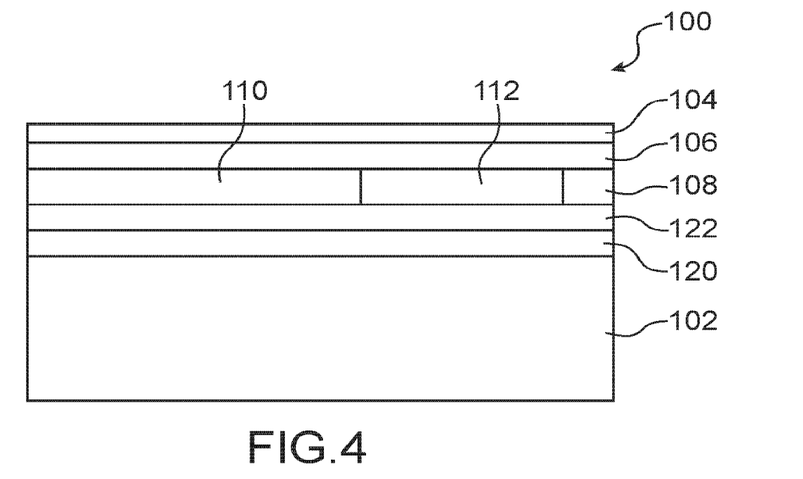

FIG. 4 shows a third embodiment of the substrate 100.

In this third embodiment, the substrate 100 comprises a buffer layer 122 in addition to layers 102, 104, 106, 108 and 120 described above. This buffer layer 122 can limit or otherwise amplify recrystallization of the material in layer 108. For example, this buffer layer 122 comprises a semiconductor oxide or nitride. This layer 122 can be made as described in document FR 2 973 158. It is also possible that the buffer layer 122 is used in the substrate 100 without the thermal layer 120.

Regardless of the embodiment of the substrate 100, this substrate 100 will be used to make a semiconducting device 200 comprising FDSOI components and passive and/or RF components.

A method of making such a device 200 from the substrate 100 is described below with reference to FIGS. 5A to 5D. The substrate 100 used in this method corresponds to the substrate 100 according to the first embodiment described above. However as a variant, it is possible to use the substrate according to one of the other embodiments described above.

When the substrate 100 comprises several first regions 110 and/or several second regions 112, the steps described below can be used for several or for each of the first regions 110 and/or the second regions 112.

Figure 5A:
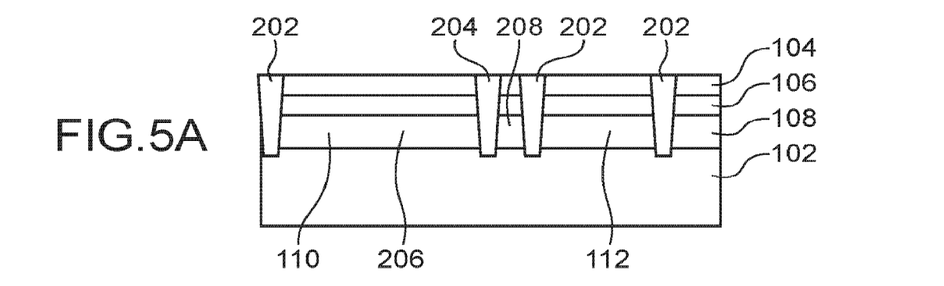
FIGS. 5A to 5D show the steps in a method of fabricating a semiconductor device, comprising FDSOI components and RF and/or passive components fabricated on the same substrate.
Figure 5B:
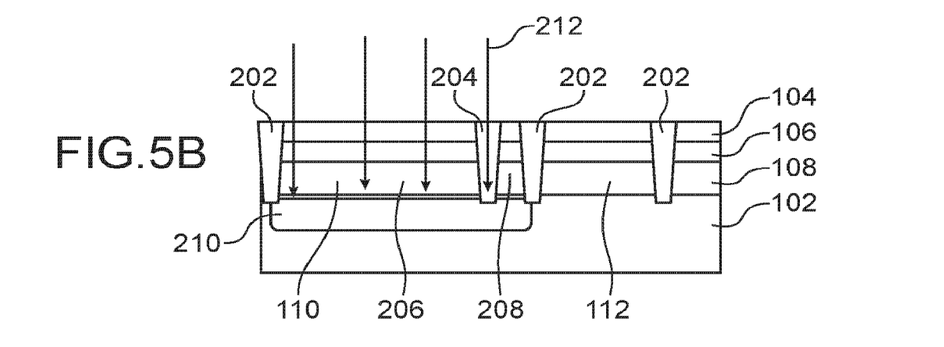

As shown on FIG. 5A, first insulating trenches 202 are made through the surface layer 104, the buried dielectric layer 106 and the trap rich layer 108. These first trenches 202 electrically separate the first region 110 from the second region 112, within the trap rich layer 108.

One or several second insulation trenches 204 are also made through layers 104, 106 and 108 so as to electrically isolate a first part 206 from a second part 208 of the first region 110, within the first region 110 through which this or these second trenches 204 pass.

An implantation of dopants is then carried out in a portion 210 of the layer 102 that is located in contact with the first region 110 of the layer 108, and underneath this layer. On FIG. 5B, the dopant implantation beams are symbolically represented by arrows with reference 212. The portion 210 of semiconductor on which this implantation of dopants was carried out forms a doped well electrically connecting the first and the second parts 206, 208 of the first region 110 to each other.

Figure 5C:
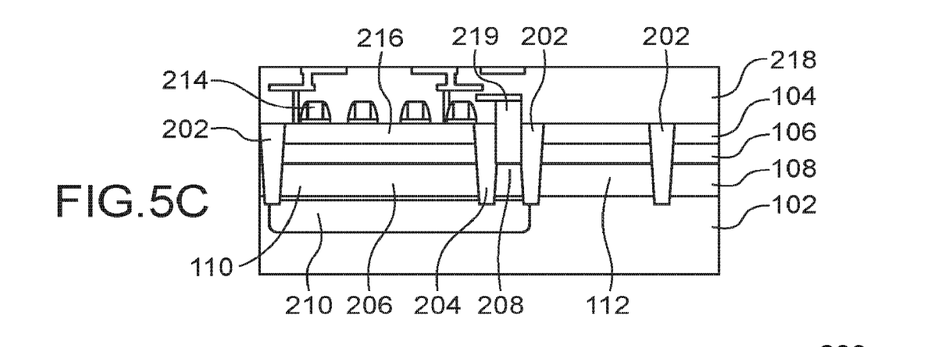

FDSOI type components 214, particularly FDSOI transistors, are made in a first portion of the surface layer 104 that is superposed on the first region 110 of the layer 108, and particularly in a first portion 216 of the surface layer that is superposed on the first part 206 of the first region 110 and that is well adapted to the fabrication of FDSOI components due to the previous recrystallization of the first region 110. These components 214 are connected to electrical interconnection levels formed within the intermetal dielectric layers 218 (FIG. 5C).

At least one electrical contact 219 is made through parts of the layers 104 and 106 that are located above the second part 208 of the first region 110. This electrical contact 219 enables electrical access to the first part 206 of the first region 110, through the doped portion 210 and the second part 208 of the first region 110, and applies the desired electrical potential onto this first part 206 of the first region 110 that forms a back polarisation plane of the FDSOI transistors 214.

Figure 5D:
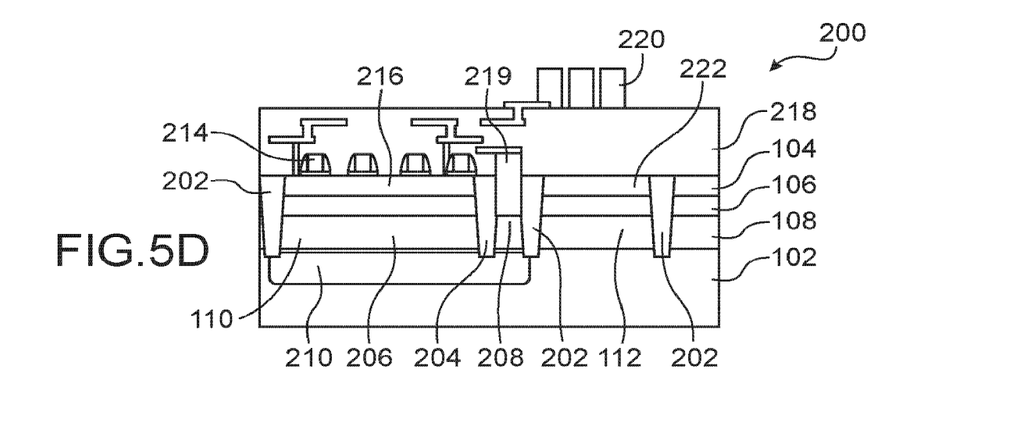

Finally, as shown on FIG. 5D, passive and/or RF components 220 are made on and/or in a second portion 222 of the surface layer 104 located above the second region 112 forming an RFSOI part of the substrate 100. On FIG. 5D, these components 220 correspond to a back-end inductor or to RF lines made above the part of the intermetal dielectric layers 218 located on the second portion 222.

In the method described above with relation to FIGS. 5A-5D, the material in the first regions 110 is recrystallized before the different components are made on the substrate 100. As a variant, this recrystallization can be done after the different components have been fabricated on the substrate 100. In this case, recrystallization is done from the back face of the substrate 100, in other words using one or more laser beams passing through the back face of the layer 102, so as not to damage components already in place on the front face of the substrate 100.

The invention claimed is:

1. A semiconductor on insulator type substrate, comprising at least:
    a support layer;
    a semiconductor surface layer;
    a buried dielectric layer located between the support layer and the semiconductor surface layer;
    a trap rich layer located between the buried dielectric layer and the support layer, and comprising at least one of a polycrystalline semiconductor material and a phase change material;
    in which the trap rich layer comprises at least one first region and at least one second region adjacent to each other in the plane of the trap rich layer, the material of the at least one first region being in an at least partially recrystallized state and having an electrical resistivity less than that of the material in the at least one second region.

2. The semiconductor on insulator type substrate according to claim 1, in which the trap rich layer comprises at least one of the following materials: polycrystalline silicon, polycrystalline germanium, polycrystalline silicon-germanium, phase change material.

3. The semiconductor on insulator type substrate according to claim 1, in which the trap rich layer comprises a phase change material that is in the crystalline state in the at least one first region and in the amorphous state in the at least one second region.

4. The semiconductor on insulator type substrate according to claim 1, also comprising a heat absorption layer located between the trap rich layer and the support layer.

5. The semiconductor on insulator type substrate according to claim 4, in which:
    the trap rich layer comprises polycrystalline silicon, and
    the heat absorption layer comprises polycrystalline germanium or polycrystalline silicon-germanium or a phase change material.

6. A semiconductor device comprising at least:
    the semiconductor on insulator type substrate according to claim 1;
    a first insulation trench passing through at least the semiconductor surface layer, the buried dielectric layer and the trap rich layer of the semiconductor on insulator type substrate and separating the at least one first region and the at least one second region in the trap rich layer of the semiconductor on insulator type substrate from each other;
    an FDSOI component made in a first portion of the semiconductor surface layer of the semiconductor on insulator type substrate that is superposed on the at least one first region of the trap rich layer of the semiconductor on insulator type substrate;
    a passive and/or RF component made in and/or on a second portion of the surface layer of the semiconductor on insulator type substrate that is superposed on the at least one second region of the trap rich layer of the semiconductor on insulator type substrate.

7. The semiconductor device according to claim 6, also comprising:
    a doped well formed in a portion of the support layer of the semiconductor on insulator type substrate and in contact with the at least one first region of the trap rich layer of the semiconductor on insulator type substrate;
    a second insulation trench passing through at least the semiconductor surface layer, the buried dielectric layer and the trap rich layer of the semiconductor on insulator type substrate and separating first and second parts of the at least one first region of the trap rich layer of the semiconductor on insulator type substrate that are electrically connected to each other through the doped well, the first part of the at least one first region of the trap rich layer of the semiconductor on insulator type substrate forming a back polarisation plane for the FDSOI component;
    an electric contact passing through the semiconductor surface layer and the buried dielectric layer, in contact with the second part of the first region of the trap rich layer of the semiconductor on insulator type substrate.

* * * * *